United States Patent [19]

Schwirtlich

[11] Patent Number: 5,431,743
[45] Date of Patent: Jul. 11, 1995

[54] SILICON FOR SOLAR CELLS, A PROCESS FOR THE PREPARATION THEREOF, AND THE USE THEREOF

[75] Inventor: Ingo Schwirtlich, Krefeld, Germany

[73] Assignee: Bayer AG, Leverkusen, Germany

[21] Appl. No.: 840,886

[22] Filed: Feb. 24, 1992

Related U.S. Application Data

[63] Continuation of Ser. No. 679,157, Mar. 26, 1991, abandoned, which is a continuation of Ser. No. 358,160, May 30, 1989, abandoned.

[30] Foreign Application Priority Data

Jun. 10, 1988 [DE] Germany .................. 38 19 778.2

[51] Int. Cl.$^6$ .................. H01L 31/0368; H01L 31/04
[52] U.S. Cl. .................. 136/258; 252/62.3 E
[58] Field of Search .......... 252/62.3 E; 136/258 PC, 136/261

[56] References Cited

U.S. PATENT DOCUMENTS 4,837,376 6/1989 Schwirtlich et al. ............... 423/348
4,877,596 10/1989 Schwirtlich et al. ............... 423/348

OTHER PUBLICATIONS

K. A. Dumas et al, *Conference Record, 15th IEEE Photovoltaic Specialists Conference* (1981), pp. 954–958.
J. R. Davis, Jr. et al, *IEEE Trans. Electron Devices*, vol. ED-27, No. 4, Apr. 1980, pp. 677–687.

*Primary Examiner*—Aaron Weisstuch
*Attorney, Agent, or Firm*—Connolly & Hutz

[57] ABSTRACT

A highly efficient material for producing electrical currents from sunlight and thus useful in solar cells is silicon with a total oxygen and carbon content of from 3 to 200 ppm and wherein the ratio of oxygen:carbon, as determined by infra-red analysis, is less than 2:1.

4 Claims, 1 Drawing Sheet

SILICON FOR SOLAR CELLS, A PROCESS FOR THE PREPARATION THEREOF, AND THE USE THEREOF

This is a continuation of application Ser. No. 679,157 filed Mar. 26, 1991, abandoned, which in turn is a continuation of application Ser. No. 358,160 filed May 30, 1989, abandoned.

The present invention relates to silicon having improved photovoltaic properties, a process for the preparation thereof, and the use thereof for the production of solar cells.

BACKGROUND OF THE INVENTION

Silicon is employed in a wide variety of applications. In the electronics industry, high-purity silicon crystals having specifically modified electronic properties are used. The high costs associated with production of these crystals only contribute slightly to the overall costs of an individual component due to the low area requirement of the individual electronic components produced therefrom. For use of silicon in photovoltaic technology, high-purity silicon is again employed for the production of high-power and concentrator cells. In this case, the purity does not relate only to metallic foreign atoms, alkaline earth metal elements, boron and phosphorus, but also to carbon and oxygen. In spite of extensive literature few details are known on the action of oxygen and carbon on the electrical properties of solar cells. These two elements are thus known as pronounced troublemakers (see: D. Helmreich, H. Seiter, D. Huber and R. Wahlich, Defect Interaction in "Solar" Silicon, IEEE 1982, pages 405 ff).

In polycrystalline silicon for terrestrial solar cells which is intended to meet the economic demands on large-scale photovoltaic technology, somewhat higher oxygen and carbon contents than in high-purity monocrystals for the electronics industry have to be accepted. However, these materials which can be produced economically have the disadvantage of only relatively low efficiency.

The object of the invention is thus to provide silicon which is suitable for photovoltaic technology and with which improved efficiency can be achieved and which can be obtained economically.

BRIEF DESCRIPTION OF THE INVENTION

Surprisingly, it has now been found that it is not only the total concentrations of oxygen and carbon that adversely effect the efficiency of silicon, but also that their ratio to one another is of great importance. Surprisingly high efficiencies arise even at relatively high concentration of the two elements if the oxygen: carbon concentration ratio is below 2. The concentrations to be employed here are the values determined by means of infra-red absorption.

BRIEF DESCRIPTION OF THE DRAWING

The drawing illustrates in graphic fashion the percent efficiency versus the oxygen to carbon ratio of various silicon materials in a solar cell.

DETAILED DESCRIPTION OF THE INVENTION

Figure 1:
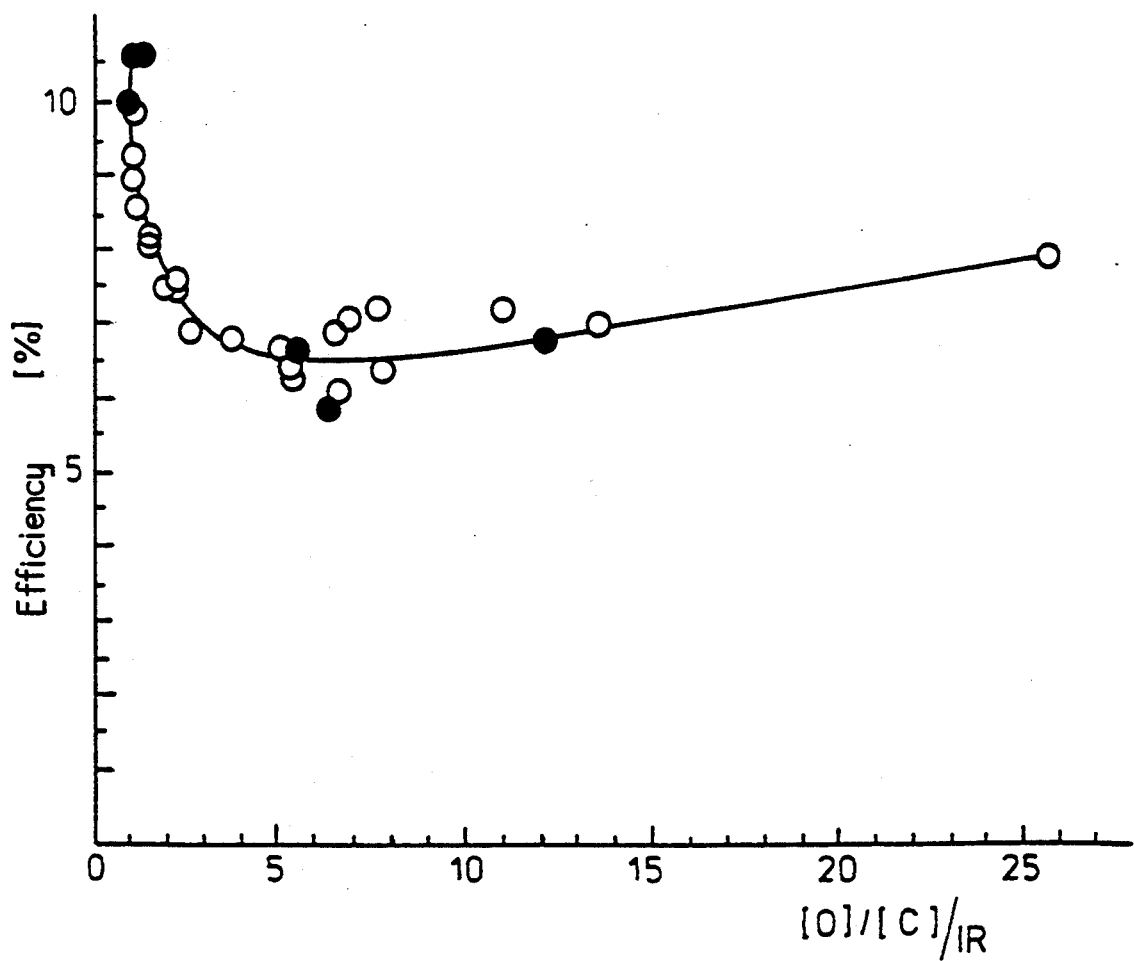

The invention thus relates to polycrystalline silicon in which the concentration ratio between the oxygen and carbon content determined by means of IR is less than 2:1 and the total concentration of oxygen and carbon impurities is between 3 and 200 ppm (weight). Silicon according to the invention which is particularly preferred here is that in which the total concentration of oxygen and carbon impurities is between 5 and 100 ppm (weight). Particularly good results can be achieved using silicon in which the concentration ratio is about 1 and the total concentrations of the elements carbon and oxygen are about 20 ppm (weight).

This invention also relates to a process for the preparation of the silicon according to the invention. The latter is preferably prepared by a process in which the carbon content of the silicon is initially reduced, and the oxygen content is subsequently modified by removing oxygen gas. The carbon content can advantageously be reduced by the process described in DE-A 3,627,624 which corresponds to U.S. Pat. No. 4,877,596. Corresponding to this procedure, a temperature gradient is established between the base and the upper side in the crucible containing molten silicon. The carbon present in the melt crystallizes out on the cooler side. A further possibility is to aerate the silicon melt with reactive gases, as described in German Patents Applications DE-A 3,635,064 which corresponds to U.S. Pat. No. 4,837,376, DE-A 3,727,646 and DE-A 3,727,647.

The oxygen content can be modified correspondingly from the melt at pressures of about 1 mbar by degassing (I. A. Amick, J. P. Dismukes, R. W. Francis, L. P. Hunt et al. Proc. of the Symp. on Materials and New Processing Technologies for Photovoltaics 1983, Vo. 83-11, The Electrochemical Society Inc., 10 South Main St., Pennington, N.J., pp. 67).

In a preferred embodiment of the process according to the invention, the silicon is prepared by reducing gaseous silicon tetrachloride using solid aluminium. A process of this type is disclosed in EP-B 123,100.

As can be seen from FIG. 1, the silicon materials according to the invention exhibit very good efficiencies. The efficiencies fall off significantly above an oxygen: carbon ratio of greater than 2.

In FIG. 1, the average efficiencies of a large number of samples and the values given in Table 1 are in each case plotted as a function of the oxygen:carbon ratio. The increase in the average efficiency begins at 2 and reaches maximum values at 1.

Due to these good efficiencies, the silicon according to the invention is highly suitable for the production of solar cells. This invention thus relates to the use of silicon for the production of solar cells.

The invention is described below by means of examples, without this representing a limitation.

In the examples below, the analytical data of three silicon samples are given from which solar cells having efficiencies of 10% and more have been produced. The oxygen and carbon values here are IR data, given in ppma; the concentrations of the other elements were determined via the atomic emission lines. The concentration at these values is given in ppmg. The dots are the values from Table 1, and the circles are the results achieved by means of the average.

TABLE 1

| | | | | | Examples | | | | | | | | | |
|---|---|---|---|---|---|---|---|---|---|---|---|---|---|---|
| Ser. No. | IR (ppma) C | IR (ppma) O | $\frac{[O]}{[C]}$ | η % | Al | B | Ca | Cr | Cu | Fe | Mg | Ni | P | Ti |
| 1 | 16.8 | 20.0 | 1.2 | 10.6 | 1.5 | 0.2 | 0.6 | <0.1 | 0.3 | 0.2 | <0.1 | <0.1 | 0.6 | 0.2 |
| 2 | 16.9 | 18.5 | 1.1 | 10.0 | 0.4 | 0.5 | 1.0 | <0.1 | 0.3 | 0.7 | 0.2 | 0.4 | 0.6 | 0.1 |
| 3 | 15.2 | 23.2 | 1.5 | 10.6 | 0.5 | 0.4 | 0.4 | <0.1 | 0.5 | 0.4 | 0.1 | <0.1 | 0.5 | 0.5 |
| 4 | 9.0 | 49.1 | 5.5 | 6.6 | 1.0 | 0.2 | <0.1 | 0.1 | <0.1 | 0.2 | 0.6 | <0.1 | 0.6 | <0.1 |
| 5 | 8.4 | 54.4 | 6.5 | 5.9 | 0.4 | 0.2 | 0.1 | 0.1 | 0.1 | 0.6 | 0.4 | <0.1 | 0.5 | 0.1 |
| 6 | 4.5 | 54.8 | 12.2 | 6.9 | 0.1 | 0.2 | <0.4 | <0.1 | 0.3 | 0.8 | 0.2 | <0.1 | 0.4 | <0.1 |

What is claimed is:

1. Polycrystalline silicon with a total oxygen and carbon content of from 3 to 200 ppm (weight) and wherein the ratio of oxygen:carbon, as determined by infra-red analysis, is less than 2:1.

2. Silicon according to claim 1 wherein the total concentration of oxygen and carbon impurities is between 5 and 100 ppm (weight).

3. Silicon according to claim 1 wherein the oxygen:carbon ratio is about 1 and the total concentration of the elements carbon and oxygen are about 20 ppm (weight).

4. In an improved solar cell containing polycrystalline silicon as a photovoltaic means for creating electrical currents, the improvement comprising said polycrystalline silicon being silicon with a total oxygen and carbon content of from 3 to 200 ppm and wherein the ratio of oxygen to carbon, as determined by infra-red analysis, is less than 2:1.

* * * * *